United States Patent

Wenzig

[15] 3,679,948

[45] July 25, 1972

[54] VARIABLE CAPACITANCE DIODE

[72] Inventor: Wolfgang Wenzig, Munich-Solln, Germany

[73] Assignee: Siemens Aktiengesellschaft, Berlin and Munich, Germany

[22] Filed: Dec. 11, 1969

[21] Appl. No.: 884,348

[30] Foreign Application Priority Data

Dec. 17, 1968 Germany ......................P 18 15 158.1

[52] U.S. Cl. ............317/234 R, 317/234 UA, 317/235 AM, 317/235 AN

[51] Int. Cl. ............H01l 13/00

[58] Field of Search ............317/235, 234

[56] References Cited

UNITED STATES PATENTS 3,335,337 8/1967 Kasugai et al. ............317/234

OTHER PUBLICATIONS

" Hypersensitive Voltage Variable Capacitor" – by H. Frazier, Semiconductor Products, March, 1960

*Primary Examiner*—John W. Huckert
*Assistant Examiner*—E. Wojciechowicz
*Attorney*—Curt M. Avery, Arthur E. Wilfond, Herbert L. Lerner and Daniel J. Tick

[57] ABSTRACT

A semiconductor diode for use as voltage dependent capacitance with $p^+n^+n$ or $n^+p^+p$ structure. The concentration of the dopant that determines the conductance type of the middle $n^+$ or $p^+$ region decreases monotonously at least in one component region of said zone, as its distance from the p-n junction increases. The outer $p^+$ or $n^+$ region is so strongly doped that the space charge region of the p-n junction extends at least predominantly into the $n^+n$ or $p^+p$ region. The coating of the $n^+n$ or $p^+p$ regions is so adjusted that its concentration N(x), in dependence on the distance $x$ from the p-n junction of the diode, meets everywhere the Equation $N(x) > -x/3\ dN/dx$.

3 Claims, No Drawings

VARIABLE CAPACITANCE DIODE

It is known to employ the capacitance of semiconductor diodes (varactors) poled in blocking direction, for the tuning of resonance circuits, for example, as described in the magazine "Wireless World", April 1962, pages 153–156. Diodes of $p^+n^+n$ or $n^+p^+p$ can be used to increase the voltage dependence of the capacitance of such a p-n junction. These diodes are preferably produced by first diffusing an activator from one side of a wafer shaped *n* or *p* conducting semiconductor crystal, that produces the same conductance type and thereafter diffuses at the same spot, an activator which produces the opposite conductance type to the original material. This results in a doping distribution in the middle zone, such that the concentration N(x) of the dopant that determines the conductivity of the middle region decreases as its distance *x* from the p-n junction, increases, in order to assume a constant value in the weaker-doped region of the same conductance type.

The invention relates to a semiconductor diode to be employed as a voltage dependent capacitance with $p^+n^+n$ or $n^+p^+p$ structure whereby the concentration of the dopant that determines the conductance type of the middle $n^+$ or $p^+$ region decreases monotonously in a component region of said zone, as its distance from the p-n junction increases and the outer $p^+$ or $n^+$ region is so highly doped that the space charge zone of the p-n junction extends, at least predominently, into the $n^+n$ or $p^+p$ regions (middle $n^+$ or $p^+$ region).

When a capacitance diode is employed in a resonance circuit within a signal transmission path such as an HF amplifier, then the curvature of the CV characteristic line will influence the quality of the transmission path. Particularly bad qualities occur when the curvature of the characteristic changes the polarity. In characteristic lines, when the polarity of the curvature does not change, said curvature is, for example, always positive and becomes continually smaller while the characteristic line is intersected. In the above case of a polarity change of the curvature, the latter is first positive, for example, while traversing the characteristic, then negative and at the end of the characteristic line is again positive. At the junction from the positive to the negative curvature, the socalled turning points, the steepness of the CV characteristic line changes reversibly while traversing the latter. If, for example, it decreases continually at first, it increases following the first turning point, so as to decrease again after passing the next turning point.

This variable behavior of the steepness has a direct influence upon the small signal transmission since the latter is determined by the steepness. A curvature of the characteristic line always leads to a distortion of the signal, whereby said distortion also depends on the magnitude of the HF signal. At the locations of the characteristic line, where the curvature changes the polarity, the signal distortion is particularly large. For this reason, it is of advantage to avoid characteristic lines with turning points.

When a selective HF amplifier with variable frequency is produced in a known manner by combining a tunable HF circuit by means of two variable capacitances, with a tunable oscillator, in such a way that the frequency difference (intermediate frequency) is constant and a frequency conversion of the HF signal into an intermediate frequency takes place, then the so-called synchronous operation is important, that is, the frequency difference should be constant in the entire tuning range. When such an HF amplifier is constructed by means of two capacitance diodes, then the synchronous operation occurring in the turning points is particularly bad, due to the effects described above, i.e. there is a particularly great deviation of the intermediate frequency from the datum value. In such cases, the polarity-frequency amplifier must be of wideband design which does not afford a good selection.

From the aforementioned examples, I find that it is favorable to construct capacitance diodes which have no turning points in the CV characteristic line.

According to my invention, this is achieved by adjusting the doping of the $n^+n$ respectively $p^+p$ regions in such a way that their concentration N(*x*) which must always be considered to be positive and, in dependence of the also always positive distance *x* from the p-n junction of the diode, satisfies everywhere the Equation:

$$N(x) > -x/3\ dN/dx$$

Then the function C=C(V) has no turning points.

Thus, the important factors during the production of a capacitance diode according to the invention, are the dopant features which are used to produce the middle $p^+$ or $n^+$ region. Essential also is the selection of the dopant concentration in the *p* or *n* region, in order to meet the requirements. These can be controlled by the precipitation of the semiconductor material of the middle zone from a reaction gas, compounded with controllably varied amounts of dopant or, by the indiffusion of the dopant, for example from the gaseous phase. In the first instance, it is possible to obtain any desired concentration functions. Contrary to diffusion processes, such a method is very expensive so that the diffusion from a gaseous phase is usually employed in actual practice. Depending on the starting conditions, the following two possibilities (embodiments) during a simple diffusion are differentiated:

1. When the concentration $N_o$ is kept constant at the semiconductor surface, the diffusion profile is defined through the function:

$$N = N_o \operatorname{erfc} X/L$$

wherein $N_o$ is the concentration at the surface of the semiconductor crystal, *x* the distance from the surface and L the diffusion length, which is expressed through the diffusion time *t* and the diffusion coefficient *D*, in the following manner:

$L = 2\sqrt{Dt}$ and erfc is the complement to the normalizing Gauss error integral.

2. When the surface concentration $N_o$ is maintained only in the first moment of the diffusion process and no additional feed, nor diffusion of dopant material takes place, one obtains for the concentration N from x, the so-called Gauss distribution, which is given by the expression $N(x) = N_o \exp(-x^2/4\,Dt)$, whereby exp is the natural exponential function.

In the following, the invention will be disclosed in greater detail with reference to embodiment examples of $p^+n^+n$ type.

a. A good approximation for both functions is given by an exponential distribution $N = N_j\,(-\beta x) + N_B$, whereby $N_j$ defines the concentration of the $n^+$ region at the p-n junction, i.e. at the boundary of the $p^+$ and the $n^+$ region, while $N_B$ is the concentration of the *n*-region. Here, *x* , is the distance from the p-n junction and $\beta$ a suitably selected constant. This function curve considers the diffusion profile as well as the constant doping of the *n*-region into which the dopant, that produces the same conductance type, is indiffused in order to produce the middle redion. In this case, the ratio of $N_B$ to $N_j$ must be larger than $6.11 \cdot 10^{-3}$ in order to avoid the occurrence of a turning point.

This approximation is useful for a purely Gauss type distribution as well as for the distribution of the complement of the error integral with perfect approximation. For the complement of the error integral, quantitative calculations can be executed which are based on the formulation $N = N_o \operatorname{erfc} X/L + N_B$. Here, in contrast to the previous example, *x*=o, wherein *x* is the value which appertains to the semiconductor surface and $x_j$ is the distance of the p-n junction from the semiconductor surface. In this instance we receive the following analogous Equation:

$$\frac{N_B}{N_0} > \frac{2}{3\sqrt{\pi}L}\,(a - x_j)\exp\left(-\frac{a^2}{L^2}\right) - erfc\ \frac{a}{L},$$

whereby $$a = \frac{x_j}{2} + \sqrt{2L^2 + \frac{1}{4} \times j^2}\ \text{is.}$$

I claim:

1. Semiconductor diode to be used as a voltage dependent capacitance, whose semiconductor crystal has a p-n junction and three zones (p+n+n or n+p+p) with variable conductivity wherein a first zone, having the strongest doping concentration of the three zones of one conductance type (p+ or n+) and a weaker doped second zone of opposite conductance type (n+ or p+) are adjacent each other in the p-n junction, while a third zone (*p* or *n*) which is doped even less than the second zone and has the conductance type of the second zone, does not participate in bordering the p-n junction whereby the dopant concentration N in the second zone which borders the p-n junction, decreases monotonously at a growing distance x from the p-n junction and conforms with equation $N(x) > -x/3\ dN/dx$ and the space charge zone in the p-n junction extends predominantly into the second zone of the semiconductor crystal.

2. A semiconductor diode according to claim 1, wherein the p-n junction is produced through a diffusion of two oppositely acting dopants into an original crystal of one conductance type and the concentration $N_j$ of the middle region at the p-n junction, as well as the concentration $N_B$ of the original crystal, satisfies the Equation $N_B/N_j > 6.11 \cdot 10^{-3}$.

3. Electrical oscillating circuit device with a semiconductor diode as a tunable capacitance wherein the semiconductor body of the semiconductor diode has a p-n junction and three zones of variable conductivity where a first zone of the one conductance type, p+ or n+, has the strongest dopant concentration of the three zones and a somewhat weaker doped second zone of opposite conductance type (n+ or p+) are adjacent in the p-n junction while a third zone (*p* or *n*) which is doped even weaker than the second zone and has the conductance type of the second zone does not participate in limiting the p-n junction, and further the doping concentration N in the second zone which limits the p-n junction decreases monotonously, at a growing distance *x*, from the p-n junction and complies all over with the relation $N(x) > -x/3\ dN/dx$ and the space change zone in the p-n junction extends predominantly into the second zone of the semiconductor crystal.

* * * * *